(12) United States Patent
Xie et al.

(10) Patent No.: US 12,165,709 B2
(45) Date of Patent: Dec. 10, 2024

(54) MEMORY CELL VOLTAGE LEVEL SELECTION

(71) Applicant: Micron Technology, Inc., Boise, ID (US)

(72) Inventors: Tingjun Xie, Milpitas, CA (US); Murong Lang, San Jose, CA (US); Fangfang Zhu, Boise, ID (US); Jiangli Zhu, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 319 days.

(21) Appl. No.: 17/876,346

(22) Filed: Jul. 28, 2022

(65) Prior Publication Data

US 2023/0395152 A1    Dec. 7, 2023

Related U.S. Application Data

(60) Provisional application No. 63/348,471, filed on Jun. 2, 2022.

(51) Int. Cl.
| | |
|---|---|
| *G11C 16/04* | (2006.01) |
| *G11C 16/08* | (2006.01) |
| *G11C 16/10* | (2006.01) |
| *G11C 16/26* | (2006.01) |
| *G11C 16/32* | (2006.01) |

(52) U.S. Cl.
CPC ............ *G11C 16/102* (2013.01); *G11C 16/08* (2013.01); *G11C 16/26* (2013.01); *G11C 16/32* (2013.01)

(58) Field of Classification Search
CPC ....... G11C 16/102; G11C 16/08; G11C 16/26; G11C 16/32
See application file for complete search history.

(56) References Cited

U.S. PATENT DOCUMENTS

| | | | |
|---|---|---|---|
| 9,928,920 B2 | 3/2018 | Kurosawa et al. | |
| 10,956,049 B2* | 3/2021 | Tomic | G06F 3/0631 |
| 2012/0155168 A1 | 6/2012 | Kim et al. | |
| 2012/0239976 A1 | 9/2012 | Cometti et al. | |
| 2015/0332777 A1 | 11/2015 | Yoon et al. | |
| 2022/0300193 A1* | 9/2022 | Gao | G06F 3/0656 |
| 2023/0395107 A1* | 12/2023 | Madraswala | G06F 11/10 |

* cited by examiner

*Primary Examiner* — Pho M Luu
(74) *Attorney, Agent, or Firm* — Brooks, Cameron & Huebsch, PLLC

(57) ABSTRACT

A method includes performing, over a time period, a quantity of write operations associated with a quad-level cell (QLC) memory block, determining the time period exceeds a threshold time, designating the QLC memory block as a bimodal, determining a voltage threshold level of a last successful read operation associated with the QLC memory block, and setting a read threshold level of at least a portion of the QLC memory block at the voltage threshold level of the last successful read operation.

20 Claims, 5 Drawing Sheets

US 12,165,709 B2

MEMORY CELL VOLTAGE LEVEL SELECTION

TECHNICAL FIELD

Embodiments of the disclosure relate generally to memory sub-systems, and more specifically, relate to memory cell voltage level selection.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
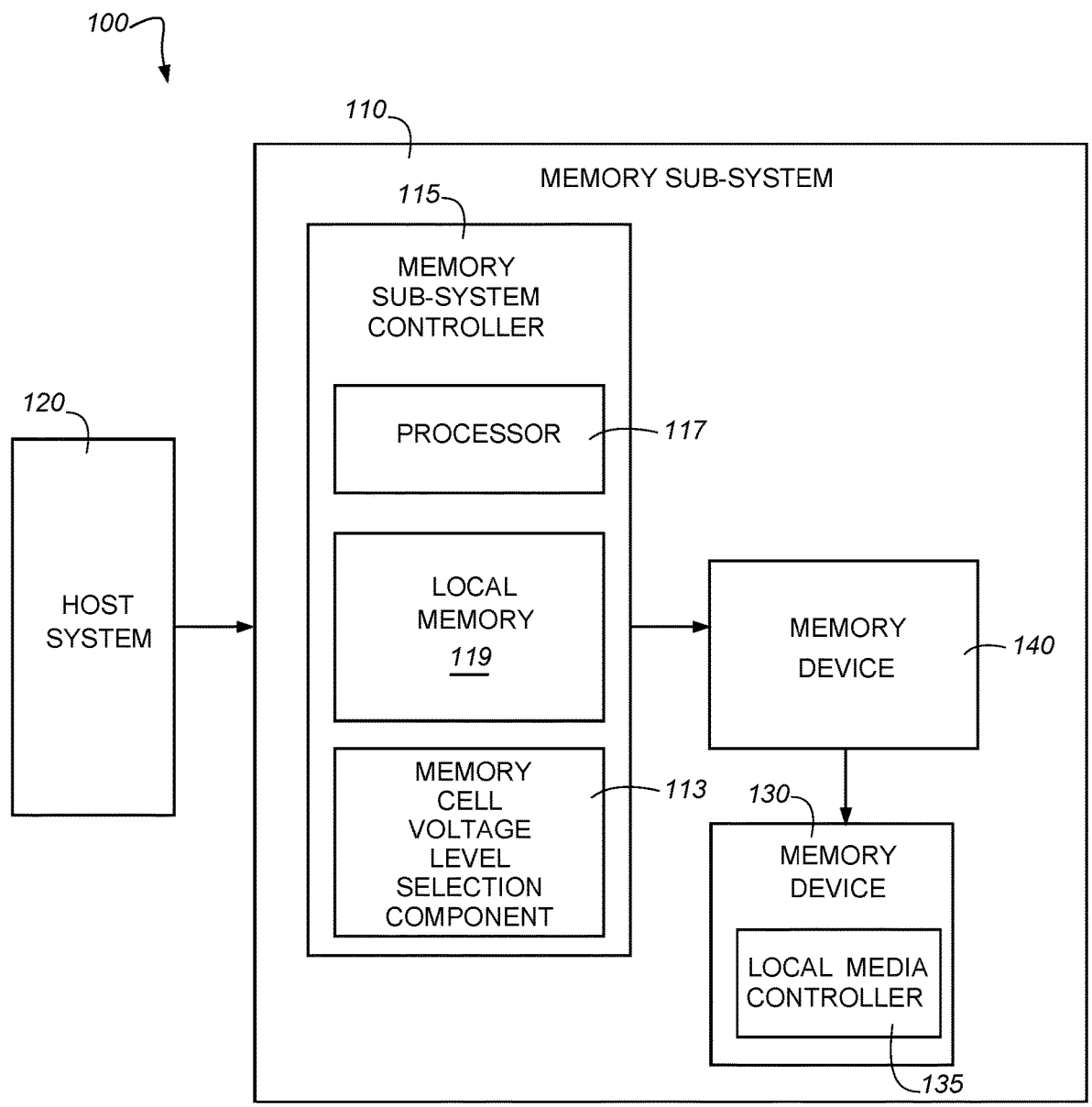
FIG. 1 illustrates an example computing system that includes a memory sub-system in accordance with some embodiments of the present disclosure.

Aspects of the present disclosure are directed to memory cell voltage level selection, in particular to memory sub-systems that include a selective memory cell voltage level component. A memory sub-system can be a storage system, storage device, a memory module, or a combination of such. An example of a memory sub-system is a storage system such as a solid-state drive (SSD). Examples of storage devices and memory modules are described below in conjunction with FIG. 1, et alibi. In general, a host system can utilize a memory sub-system that includes one or more components, such as memory devices that store data. The host system can provide data to be stored at the memory sub-system and can request data to be retrieved from the memory sub-system.

A memory device can be a non-volatile memory device. One example of non-volatile memory devices is a negative-and (NAND) memory device (also known as flash technology). Other examples of non-volatile memory devices are described below in conjunction with FIG. 1. A non-volatile memory device is a package of one or more dice. Each die can consist of one or more planes. Planes can be groups into logic units (LUN). For some types of non-volatile memory devices (e.g., NAND devices), each plane consists of a set of physical blocks. Each block consists of a set of pages. Each page consists of a set of memory cells ("cells"). A cell is an electronic circuit that stores information. A block hereinafter refers to a unit of the memory device used to store data and can include a group of memory cells, a word line group, a word line, or individual memory cells. For some memory devices, blocks (also hereinafter referred to as "memory blocks") are the smallest area than can be erased. Pages cannot be erased individually, and only whole blocks can be erased.

Each of the memory devices can include one or more arrays of memory cells. Depending on the cell type, a cell can be written to in order to store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple level cells (TLCs), and quad-level cells (QLCs). For example, a SLC can store one bit of information and has two logic states.

Some NAND memory devices employ a floating-gate architecture in which memory accesses are controlled based on a relative voltage change between the bit line and the word lines. Other examples of NAND memory devices can employ a replacement-gate architecture that can include the use of word line layouts that can allow for charges corresponding to data values to be trapped within memory cells based on properties of the materials used to construct the word lines.

Data stored in a memory cell can become unreliable (e.g., lost) due to various factors. Memory cells (e.g., volatile memory cells) can be periodically refreshed (e.g., via a block refresh) at a particular rate. Although, periodically refreshing memory cells can be sufficient (e.g., frequent enough) to maintain data integrity, in many instances memory cell charges can change due to various factors and/or a memory cell can wear-out over time. For example, charge leakage from memory cells can result in a loss of data. Charge leakage or charge loss can be evidenced by a temporal voltage shift in the memory block. As used herein, a temporal voltage shift (TVS) generally refers to the change in the measured voltage of cells as a function of time. An amount of charge leakage from a memory block can vary based on a duration of time from a previous memory operation (e.g., previous write operation) associated with the memory block.

For example, a first memory block written at a first time can experience a greater degree of charge leakage than a second memory block written at a second time that is more recent than the first time. Thus, an access voltage which can successfully accesses data associated with the first memory block can be different (e.g., lower) than an access voltage which can successfully access data associated with the second memory block. As used herein, successfully accessing the data associated with a memory block refers to assessing data having a given health characteristic value such as a suitable raw bit error rate (RBER) such that the data can be discerned by a host with or in the absence of performing error correction operations or other types of data remediation on the data. As used herein, a RBER refers to a data quality metric that can be computed after the successful decoding of the data (e.g., by comparing bits before and after a successful decoding).

Various approaches can store data in SLC memory blocks and subsequently migrate the data to portions of an individual QLC memory block. For instance, data can be migrated from two SLC blocks into a portion of but not all of an individual QLC memory block at a given time.

Subsequently, data can be migrated from two SLC blocks into a different portion of the individual QLC memory blocks at a later time. Writing data into a portion of a memory block such as QLC memory block can provide performance advantages as compared to writing the entire memory block at a given time. For instance, after migration of the data from the SLC blocks, the SLC blocks can be released into a free block pool and thus can be utilized for other memory operations.

Yet, if a time period between an initial migration of data to a first portion of a QLC memory block and a final migration of data is sufficiently long there can be a disparate degree of charge loss between the portions of the QLC memory block. As a result, a default voltage threshold level may not be suitable for different portions of a QLC memory block. Examples of a default voltage threshold level such as a default read threshold include a device default read threshold (e.g., a predetermined value or plurality of read values), a desired final pass voltage (VpassR) based read threshold, and/or a system-managed read threshold, among other possible types of default read thresholds.

Accordingly, employing the same default read threshold level for the entire physical memory block such as an entire QLC memory block (e.g., for both the upper deck and the lower deck) when the difference in charge loss between the upper deck and the lower deck is sizable can result in a failed read and/or obtaining data with an undesirable heath characteristic such as a large RBER. As used herein, a "physical block of memory cells" or "physical block" generally refers to a set of memory cells that store charges corresponding to data values and has an address (e.g., a physical block address) associated therewith. For instance, a default read threshold level may be too high for memory cells in the lower deck (e.g., which have experienced a greater degree of charge loss than memory cells in a more recently written upper deck) and may result in a failed read operation (which does not return some or all data stored in memory cells and/or returns data that has an undesirable heath characteristic such as a large RBER). Failed read operations can degrade performance of a memory sub-system. Degradation of performance can be undesirable, especially in critical applications and/or in demanding applications in which very high memory sub-system performance is expected. Further, this degraded performance that can be exhibited in such approaches can be further exacerbated in mobile (e.g., smartphone, internet of things, etc.) memory deployments in which an amount of space available to house a memory sub-system is limited in comparison to traditional computing architectures.

Aspects of the present disclosure address the above and other deficiencies by performing, over a time period, a quantity of write operations associated with a memory block (e.g., a QLC block), determining the time period exceeds a threshold time, determining a voltage threshold level of a last successful read operation associated with the memory block, and setting a read threshold level of at least a portion of the memory block at the voltage threshold level of the last successful read operation, as detailed herein. That is, approaches herein account of differences in charge loss experienced by the different portions of the QLC block due to differences in respective programming times of the different portions of the QLC memory block.

For instance, approaches herein can determine a voltage threshold level of a last successful read operation associated with the QLC memory block such as a last successful read operation associated with the lower deck of the QLC memory block and can set a read threshold level of the QLC memory block (e.g., of at least the lower deck) at the voltage threshold level of the last successful read operation. Setting the voltage threshold level of at least the lower deck of the QLC memory block at the voltage threshold level of the last successful read operation can ensure a subsequent read operation is conducted at the voltage threshold level of last success read operation and thereby mitigate the possibility of a failed read or returning data with an undesirable health characteristic (e.g., a high RBER) that would otherwise result from performing the read operation at a default voltage threshold level.

The last successful read operation can be a successful initial read that results in data which is successfully decoded (e.g., with or in the absence of error correction, etc.). However, in some instances the last successful read operation can be a successful read-retry operation that results in data that is successfully decoded and that is performed at a different voltage than and subsequent to a failed initial read operation.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, server, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, and the like.

The host system 120 can include a processor chipset and a software stack executed by the processor chipset. The processor chipset can include one or more cores, one or more caches, a memory controller (e.g., an SSD controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130, 140 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs), and penta-level cells (PLC) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, a MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as three-dimensional cross-point arrays of non-volatile memory cells and NAND type memory (e.g., 2D NAND, 3D NAND) are described, the memory device 130 can be based on any other type of non-volatile memory or storage device, such as such as, read-only memory (ROM), phase change memory (PCM), self-selecting memory, other chalcogenide based memories, ferroelectric transistor random access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

As described above, the memory components can be memory dice or memory packages that form at least a portion of the memory device 130. In some embodiments, the blocks of memory cells can form one or more "superblocks." As used herein, a "superblock" generally refers to a set of data blocks that span multiple memory dice and are written in an interleaved fashion. For instance, in some embodiments each of a number of interleaved NAND blocks can be deployed across multiple memory dice that have multiple planes and/or pages associated therewith. The terms "superblock," "block," "block of memory cells," and/or "interleaved NAND blocks," as well as variants thereof, can, given the context of the disclosure, be used interchangeably.

The memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory device 130 and/or the memory device 140. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address, physical media locations, etc.) that are associated with the memory devices 130. The memory sub-system controller 115 can further include host interface circuitry to communicate with the host system 120 via the physical host interface. The host interface circuitry can convert the commands received from the host system into command instructions to access the memory device 130 and/or the memory device 140 as well as convert responses associated with the memory device 130 and/or the memory device 140 into information for the host system 120.

In some embodiments, the memory sub-system 110 can include a cache or buffer (e.g., DRAM) and address circuitry (e.g., a row decoder and a column decoder) that can receive an address from the memory sub-system controller 115 and decode the address to access the memory device 130 and/or the memory device 140. For instance, in some examples, the memory device 140 can be a DRAM and/or SRAM configured to operate as a cache for the memory device 130. In such instances, the memory device 130 can be a NAND.

In some embodiments, the memory device 130 includes local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 135) for media management within the same memory device package. An example of a managed memory device is a managed NAND (MNAND) device. The memory sub-system 110 can also include additional circuitry or components that are not illustrated.

The memory sub-system 110 can include a memory cell voltage level selection component 113. Although not shown in FIG. 1 so as to not obfuscate the drawings, the memory cell voltage level selection component 113 can include various circuitry to facilitate aspects of media management, as detailed herein. In some embodiments, the memory cell voltage level selection component 113 can include special purpose circuitry in the form of an ASIC, FPGA, state machine, and/or other logic circuitry that can allow the memory cell voltage level selection component 113 to orchestrate and/or perform the operations described herein.

In some embodiments, the memory sub-system controller 115 includes at least a portion of the memory cell voltage level selection component 113. For example, the memory sub-system controller 115 can include a processor 117 (processing device) configured to execute instructions stored in local memory 119 for performing the operations described herein. In some embodiments, the memory cell voltage level selection component 113 is part of the memory sub-system 110, an application, or an operating system.

In a non-limiting example, an apparatus (e.g., the computing system 100) can include a memory cell voltage level selection component 113. The memory cell voltage level selection component 113 can be resident on the memory sub-system 110. As used herein, the term "resident on" refers to something that is physically located on a particular component. For example, the memory cell voltage level selection component 113 being "resident on" the memory sub-system 110 refers to a condition in which the hardware circuitry that comprises the memory cell voltage level selection component 113 is physically located on the memory sub-system 110. The term "resident on" can be used interchangeably with other terms such as "deployed on" or "located on," herein.

The memory cell voltage level selection component 113 can be configured to perform, over a time period, a quantity of write operations associated with a quad-level cell (QLC) memory block, determine the time period exceeds a threshold time, as detailed herein. For instance, a time period can extend from a time associated with programming (migrating data into) a page (e.g., a first page) in a lower deck of a memory block to a time associated with programming a page (e.g., an upper page) in an upper deck of a memory block.

The memory cell voltage level selection component 113 can be configured to designate the QLC memory block as a bimodal. As used herein, a bimodal block refers to a block of memory cells having a time period extending from a time associated with programming at least an initial page of the memory block to a time associated with programing a last page in the memory block that exceeds the threshold time. The memory cell voltage level selection component 113 can be configured to designate the QLC memory block as a bimodal responsive to a determination that the time period exceeds the threshold time, as detailed herein.

The memory cell voltage level selection component 113 can be configured to set a read threshold level of at least a portion (e.g., the lower deck) of a memory block such as the QLC memory block at the voltage threshold level of the last successful read operation. The memory cell voltage level selection component 113 can be configured to set a read threshold level of at least a portion of the QLC memory block at the voltage threshold level of the last successful read operation responsive to designation of the memory block as a bimodal block. For instance, a read threshold level of a lower deck of the QLC memory block can be set at the voltage level of the last successful read operation, rather than a default read threshold level, as detailed herein. In some embodiments, the voltage level of the last successful read operation can be lower than the default read threshold level. As mentioned, employing a relatively lower voltage level of the last successful read operation for at least the lower deck can account for the higher degree of charge loss experienced by the lower deck (e.g., relative to a degree of charge loss experienced by a more recently programmed upper deck). Thus, approaches herein can yield improved data having desirable health characteristics (e.g., a lower RBER than a RBER of data if obtained using the default read threshold level).

Figure 2:
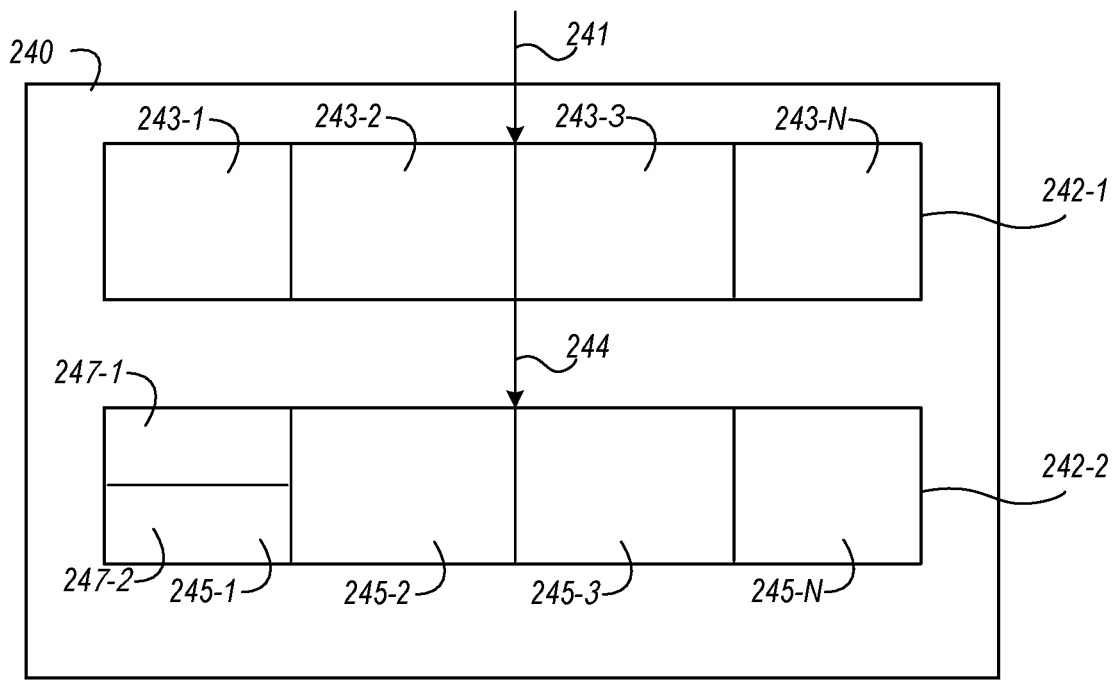
FIG. 2 illustrates an example diagram of a non-volatile memory device for memory cell voltage level selection in accordance with some embodiments of the present disclosure.

FIG. 2 illustrates an example diagram of a non-volatile memory device 240 for selective memory cell voltage level in accordance with some embodiments of the present disclosure. The diagrams of FIG. 2 illustrate aspects of performing memory cell voltage level selection for a memory sub-system having blocks of memory cells such as the memory sub-system 110.

As used herein, a non-volatile memory refers to a device having blocks of non-volatile memory cells which are configured to store various bits per memory cell. The blocks of non-volatile memory cells (243-1, 243-1, 243-3 . . . , 243-N and 245-1, 245-2, 245-3, . . . , 245-N; collectively referred to herein as blocks 243, 245) in the non-volatile memory device 240 can include blocks of non-volatile SLCs, MLCs, TLCs, QLCs, and/or PLCs, among other possibilities.

For instance, the blocks 243, 245 in the non-volatile memory device 240 can include blocks of SLCs where each SLC cell can store one bit of information and blocks of QLCs where each QLC cell can store four bits of information. In some embodiments, the blocks 243, 245 can include only a combination of SLCs and QLCs. As used herein a SLC block (or SLC memory block) refers to a block of memory cells that can each store only 1 bit of information per memory cell.

A first subset 242-1 of the non-volatile memory device 240 can be SLCs and/or can be higher level memory blocks which can be selectively configured to operate in a single-level mode, as detailed herein. In some embodiments, the first subset 242-1 can comprise a dedicated quantity of SLCs. However, in some embodiments some or all of the first subset 242-1 can be comprised of higher level (e.g., QLC blocks) which are selectively configured to operate in a single-level mode. For instance, a free non-volatile memory block of the non-volatile memory device 240 can be selectively configured to operate in the single-level mode. A "free block" (e.g., an open virtual block, physical block, and/or logical block) generally refers to a memory block where pages of the memory block are free of data (not programmed). The free non-volatile memory block (i.e., a free block) can be included in a free block pool including a plurality of free blocks. Use of a free block can promote rapid configuration of the free block to operate in a single-level mode as compared to use of other blocks having data stored therein.

In some embodiments, a media management operation such as a garbage collection can be performed to add free blocks to the free block pool. A "garbage collection operation" generally refers to a process of folding data from a victim block stripe into a new destination block stripe, with the intended purpose of data consolidation to free up memory resources for subsequent program/erase cycles. Folding can be performed to pack valid data together (garbage collection), freeing more space for new writes, for error avoidance, for wear leveling, and to restore RAIN parity protection in the event of an error. As used herein, a "block stripe" generally refers to a logical grouping of blocks that share a same upper block number and can be accessed in parallel. Garbage collection operations can include reclaiming (e.g., erasing and making available for programming) memory blocks that have the most invalid pages among blocks in the memory device(s). In some embodiments, garbage collection can include reclaiming memory blocks with more than a threshold amount (e.g., quantity) of invalid pages. However, if sufficient free memory blocks exist for a programming operation, then a garbage collection operation may not occur. Addition of the block to the free block pool can occur in the absence of a host command (e.g., a host write operation and/or a host read operation to the memory sub-system). In this way, media management as detailed herein can occur without relying on a host command and/or in the absence of any associated traffic over a bus or other connection between the host and the memory sub-system.

In some embodiments, selectively configuring free non-volatile memory blocks (from the free block pool) to operate in the single-level mode can occur until a quantity of the first subset 242-1 is equal to a target quantity of non-volatile memory blocks. As used herein, a "target quantity" generally refers to a particular total number of blocks. In some embodiments, the target quantity can be equal to 16, 32, 48, 64, 80, 96, 110 blocks, among other possible values. The target quantity can be a value that is stored in a table such as a look-up table or is otherwise stored or accessible to the memory sub-system. In any case, the selective single-level memory operation component, as detailed herein, can be configured to compare a current block count to a target quantity and thereby determine a difference between the current block count and the target quantity. Thus, free blocks can continue to be configured to operate in a single-level mode until the current block count in the first subset of non-volatile memory blocks configured to operate in a single-level mode is equal to the target quantity. Maintaining a quantity of free blocks (e.g., a quantity of free TLC blocks and/or QLC blocks) in the free block pool that is equal to or greater than a target quantity of blocks can permit the free blocks to be readily configured in a single-level mode.

The second subset 242-2 can be configured in (or remain configured in accordance with) a multi-level memory mode such as a QLC mode. For instance, as illustrated in FIG. 2 the first subset 242-1 can be formed of the blocks 243-1, 243-2, 243-3 . . . , 243-N, whereas the second subset 242-2 can be formed of block 245-1, 245-2, 245-3 . . . , 245-N can be formed of non-volatile memory blocks. In various embodiments, the first subset 242-1 is formed of blocks 245-1, 245-2, 245-3 . . . , 245-N with a respective block size (e.g., X/4 pages) that is less than a respective block size (X pages) of the second subset 242-2. In various embodiments, the blocks of the first subset 242-1 have a page size (16 kilobytes) that is less than a page size (e.g., 64 kilobytes) of the blocks of the second subset 242-2. While FIG. 2 illustrates the first subset 242-1 and the second subset 242-2 as including a given quantity of memory blocks, a quantity of blocks in in the first subset 242-1 and/or in the second subset 242-2 can be varied.

Data (as represented by element identifier 241) can be written to the first subset 242-1. Subsequently, the data (as represented by element identifier 244) can be internally migrated from the first subset 242-1 to the second subset 242-2, as detailed herein.

Each memory block in the first sub-set 242-1 can be assigned of a block index number (e.g., consecutive numbers e.g., 0 . . . N−1) such that each of the blocks can be consecutively written to for consecutive host write operations. For instance, data associated with performance of a first memory operation can be written to a first block in having a first block index value. The data can be written to pages in the first block in the first subset 242-1 until the last page in the first block is full. Data can subsequently be written to a second block (having the next block value in a sequence of block index values) in the first subset 242-1. Notably, in such instances the first block index value and the second block index value can be consecutive block index values. This manner of writing data to the SLC blocks of the first subset 242-1 can continue on a loop (e.g., such that each block is written to before performing an additional write to any given block in the first subset (e.g., the single-level cache).

The data can be migrated from the first subset 242-1 to the second subset 242-2. Such internal migration (folding) can migrate the data intact (e.g., migrate all data from the first portion 242-1 to the second portion 242-2) and thus can have a write amplification of 1, as compared to what would otherwise be multiple host write operations to directly write such data to the second subset of the non-volatile memory blocks. In this way, the data can be effectively and efficiently stored in the higher level memory cell (e.g., QLC memory blocks) of the second subset 242-2, and yet write amplification can be reduced as compared to other approaches that may seek to directly write such data to QLC blocks of the second subset 242-2.

In some embodiments, the data can be migrated from the first subset 242-1 to fill a portion of but not all of a block of the blocks in the second subset 242-2. For instance, data can be migrated to fill a first portion (e.g., a lower deck 247-2) of a block 245-1 in the second subset 242-2 at a first time and subsequently additional data can be migrated to fill a second portion (e.g., an upper deck 247-1) of the block 245-1.

In some embodiments, migration of the data from the SLC memory blocks of the first subset 242-1 includes migration of data from a plurality of SLC memory blocks into a portion of a respective (individual) QLC memory block of the second subset 242-2. That is, the plurality of SLC memory blocks can operate as a cache and can permit data to be migrated (e.g., folded) from the plurality of SLC blocks into a portion of the respective QLC block. For instance, data associated with two blocks (e.g., two SLC blocks) in the first subset 242-1 can be migrated to fill a portion (e.g., a lower deck) of a block (e.g., QLC block) in the second subset 242-2 at a first time. Additional data associated with two additional blocks (e.g., two additional SLC blocks) in the first subset 242-1 can be migrated to fill a second portion (e.g., an upper deck) of the block in the second subset 242-2 at a second time that is subsequent to the first time. Such incremental programming at a first time and a second time can have various performance advantages and/or simplify aspects related to management of the data. Yet, as mentioned writing or migrating to data at different times result in the blocks experiencing different degrees of charge loss. For instance, in the above example the memory cells associated with the data in the second portion (e.g., an upper deck) of the block in the second subset 242-2 which is migrated at the second time that is subsequent to the first time can experience less charge loss than the memory cells associated with the data in the first portion of the block.

As mentioned, despite the difference in charge loss, various approaches employ the same read threshold level to the first portion (e.g., the lower deck) and the second portion (e.g., the upper deck) of a memory block (e.g., a QLC block). Stated differently, various approaches employ a default voltage threshold level that is the same for an entire block (e.g., the same for both the upper deck and the lower deck of the memory block). However, maintaining a default voltage threshold level as the read threshold level for the entire QLC memory block when the difference is charge loss between the upper page and the lower page is sizable can result in a failed read and/or obtaining data with an undesirable heath characteristic such as a large RBER. For instance, a default voltage threshold level may be too high for memory cells in the lower deck (e.g., which have experienced a greater degree of charge loss than memory cells in a more recently written upper deck) and may result in a failed read and/or obtaining data with an undesirable heath characteristic such as data having a larger RBER. For example, a RBER associated with the data in the first portion (e.g., the lower deck) can be higher than a RBER associated with the data in the first portion (e.g., in the upper deck). Accordingly, memory cell voltage level selection can be employed, as detailed herein.

Figure 3:
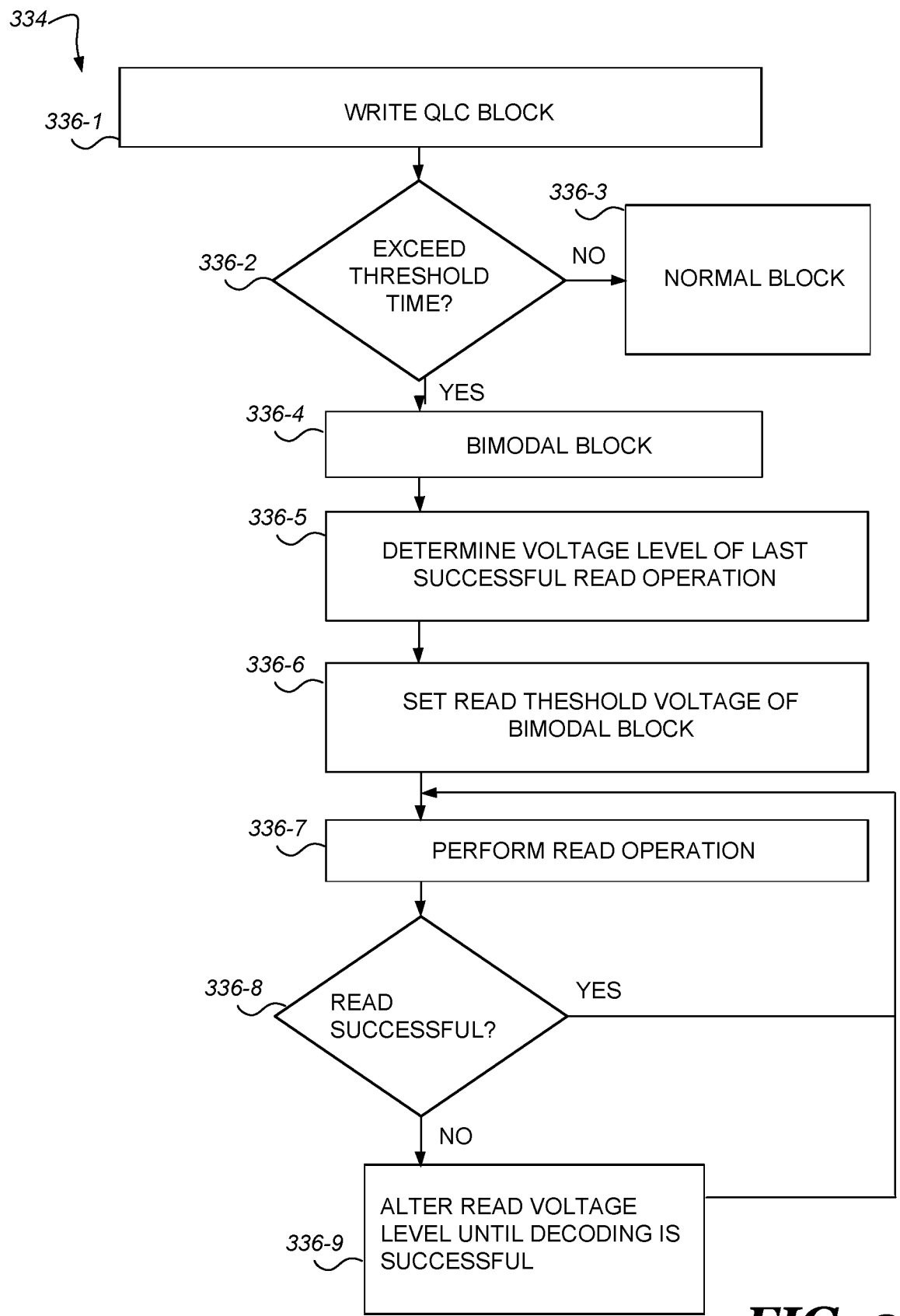
FIG. 3 illustrates a flow diagram for memory cell voltage level selection in accordance with some embodiments of the present disclosure.

FIG. 3 illustrates a flow diagram 334 for memory cell voltage level selection in accordance with some embodiments of the present disclosure. At 336-1, data can be migrated, over a time period, from a plurality of SLC memory blocks to a portion of an individual QLC memory block. For instance, a first quantity of data can be migrated at a first time from a first subset (e.g., two SLC blocks) of the SLC memory blocks to a first portion (e.g., a lower deck) of a QLC block. Subsequently, a second quantity of data can be migrated from a second subset (e.g., two SLC blocks) to a second portion (e.g., an upper deck) of the QLC block at a second time that is subsequent to the first time. That is, in some embodiments, the QLC block can include an upper portion configured to a store a first quantity of data and a lower portion configured to store a second quantity of data. In some embodiments, the upper deck can be equal to half of the size of the QLC block and the lower deck can be equal to half of a size of the QLC block. For instance, for a 64 kilobyte QLC block the upper deck can be 32 kilobytes and the lower deck can be 32 kilobytes, among other possible values.

At 336-2, the time period can be compared to a threshold time. The threshold time refers to a permissible amount to time between programming a given page such as a first page and another page such as a last page of a memory block such as the QLC memory block. The threshold time can be equal to a given quantity of time such as a given quantity of second, minutes, and/or hours, etc.

Responsive to a determination that the programming time is less than or equal to the threshold time, the flow can proceed to 336-3. At 336-3, the memory block can be designated as a normal memory block (e.g., a non-bimodal block). Thus, the memory sub-system can continue normal operations (e.g., permitting read/write operations associated with the entire memory block at a default voltage threshold level). For instance, the memory sub-system can employ a default VpassR voltage threshold level for the entire memory block (e.g., both a lower deck and an upper deck of a QLC memory block). The memory block can be designated as a normal memory block by addition of identifying information (e.g., a logical and/or physical address, etc.) associated with the memory block to a normal block list. Although other mechanisms such as designation of the memory block as a normal memory block by changing a bit in a status register and/or storing various data in a memory block such as the memory block which is designated as a normal memory block, etc. are possible.

Responsive to a determination that the programming time is exceeds the threshold time, the flow can proceed to 336-4. At 336-4, the memory block can be designated as a bimodal block. For instance, in some embodiments the memory block can be designated as a bimodal block by addition of identifying information (e.g., a logical and/or physical address, etc.) associated with the memory block to a bimodal block list. Although other mechanisms for designation of the memory block as bimodal by changing a bit in a status register and/or storing various data in a memory block such as the memory block which is designated as a bimodal memory block, etc. are possible. As mentioned, the bimodal designation indicates that a sufficient amount of time has passed between programming of a first portion and the programming of a second portion of the memory block. Thus, the bimodal block may be prone to the first portion and the second portion experiencing different degrees of charge loss which can be accounted for by employing memory cell voltage level selection, as detailed herein.

In some embodiments, the designation of the memory block as a bimodal can be removed. For instance, the memory block can be removed from a bimodal memory block list responsive to determination that the read threshold level of the memory block is substantially equal to a default voltage threshold level, responsive to the memory block being included in the bimodal block list for a threshold amount of time, responsive to a memory operation (e.g., a write operation and/or an erase operation associated with the memory block), responsive to an occurrence of a system condition and/or responsive to a system input, etc. For instance, the memory block can be removed from a bimodal memory block list responsive the read threshold level of the memory block being substantially equal to a default voltage threshold level.

At 336-5, a voltage level of a last successful read operation associated with the bimodal block can be determined. In some embodiments, the bimodal block is a QLC block including a first portion (e.g., a lower portion or lower deck) and a second portion (e.g., an upper portion or upper deck). In such embodiments, the voltage level of a last successful read operation associated with the first portion and/or the second portion can be determined. For instance, a voltage level (e.g., a read voltage level of a read operation) associated with the first portion can be determined.

At 336-6, the read threshold level for the bimodal block can be set at the voltage threshold level of the last successful read operation associated with the bimodal block. For instance, for a QLC block the read threshold level for a lower deck and/or an upper deck can be set at the voltage threshold level associated with the last successful read operation. In some embodiments, at least the read threshold level for the lower deck can be set at the voltage threshold level associated with the last successful read operation. For instance, the read threshold level for the lower deck can be set at the voltage threshold level associated with the last successful read operation and the read threshold level for the upper deck can be set to a default read threshold level. In such instances, the read threshold level for the lower deck can be lower than the default read threshold level (e.g., a VpassR based read threshold) for the upper deck.

At 336-7, a read operation can be performed at the read threshold level. As mentioned, the read threshold level can be lower than a default read threshold level. The read operation can be performed at the read threshold level responsive to receipt of signaling indicative of a host initiated read and/or a memory device initiated read. In some embodiments, the read operation can be performed responsive to receipt of signaling indicative of a host initiated read. In some embodiments, the read operation can be performed responsive to receipt of signaling indicative of a memory device initiated read.

At 336-8, it can be determined whether the read operation performed at the read threshold level was successful. For instance, a determination can be made whether data associated with the read operation is successfully decoded. Decoding can be performed by a host and/or by a component in the memory subs-system such as by a processing resource. Responsive to a determination that the data associated with the read operation is successfully decoded, the read operation can be determined to be successful. Responsive to a determination that the data is associated with the read operation is not successfully decoded, the read operation can be determined to be unsuccessful.

Responsive to a determination that the read operation performed at the read threshold level was successful the flow can return to 336-7. That is, when the read operation is successful subsequent read operations can be performed at the same read threshold level. For instance, the voltage threshold level associated with a last successful read operation can be maintained as the read threshold level for at least one subsequent read operation such as at least one subsequent read operation associated with a QLC block (e.g., a lower deck of the QLC block). After performance of each subsequent read operation of the at least one subsequent read operation a subsequent determination can be made at 336-8 whether the at least one subsequent read operation performed is successful.

Responsive to a determination that the read operation performed at the read threshold level was unsuccessful the flow can proceed to 336-9. Thus, at 336-9 the read threshold level can be altered to a different read threshold level (e.g., an altered read threshold level). For instance, the read threshold level of the QLC memory block can be altered prior to conducting a subsequent read operation associated with the QLC memory block. Altering the read threshold level prior to conducting a subsequent read operation can mitigate a possibility of an additional read operation or subsequent read operation being unsuccessful. In some embodiments, the read threshold level can be altered by decreasing the read threshold level (to a lower threshold level relative to the read threshold level employed at 336-7). However, in some embodiments, the read threshold level can be increased (relative to the read threshold level employed at 336-7).

Figure 4:
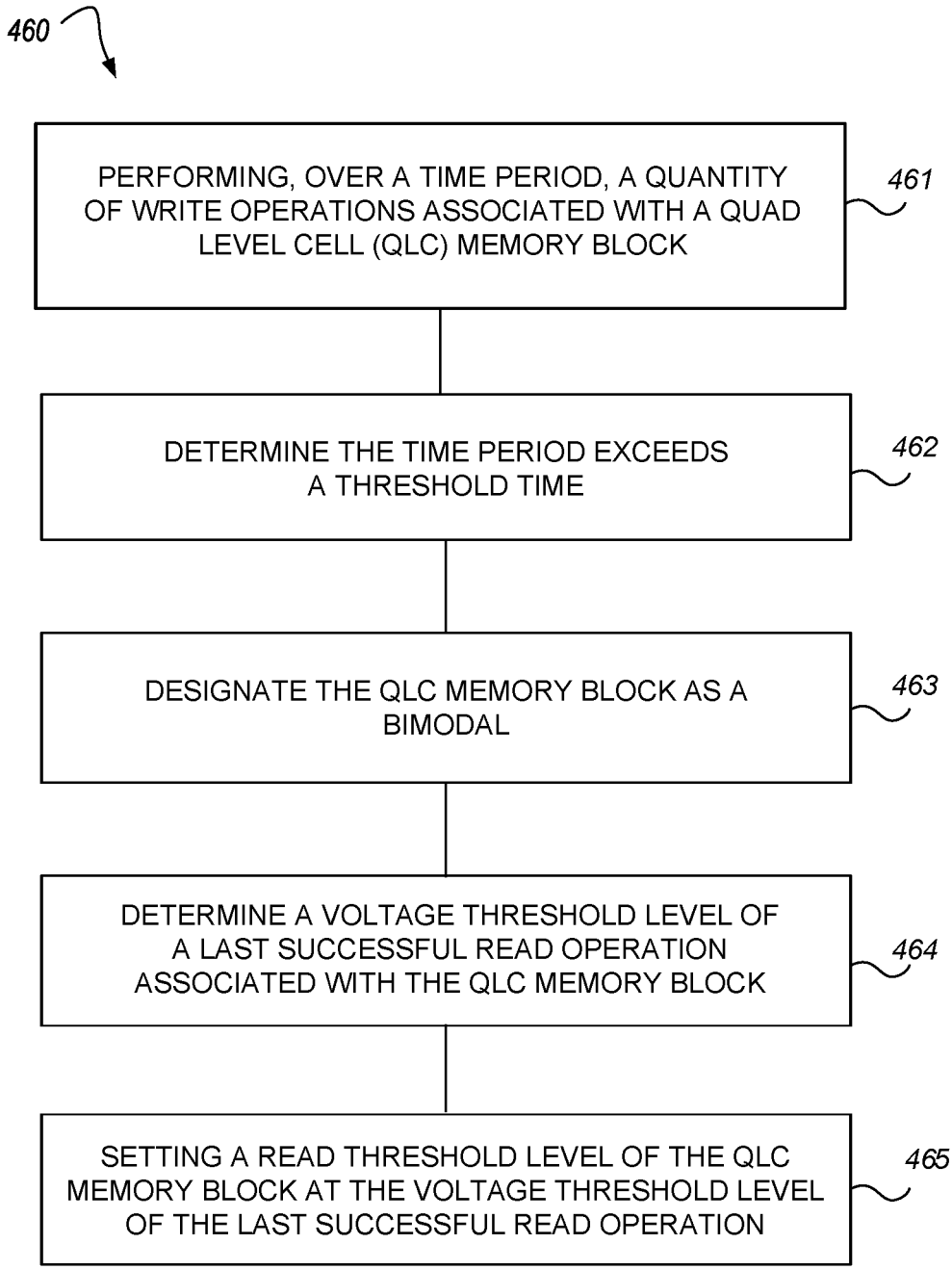
FIG. 4 is a flow diagram corresponding to a method for memory cell voltage level selection in accordance with some embodiments of the present disclosure.

FIG. 4 is a flow diagram corresponding to a method for memory cell voltage level selection in accordance with some embodiments of the present disclosure. The method 460 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 460 is performed by the memory cell voltage level selection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At 461, a quantity of write operations associated with memory block such as a QLC memory block can be performed over a time period. For instance, data can be migrated (e.g., folded) from as first subset of the non-volatile memory blocks to a second subset of non-volatile memory blocks, as detailed herein. The data can be migrated from the first subset of the non-volatile memory blocks to the second sub-set of non-volatile memory blocks responsive to a threshold amount of data (e.g., an amount of data equal to at least a portion of page size of a block in the second subset) being written to the first subset of the non-volatile memory blocks.

In some embodiments, the time period can extend from a first time of an initial write operation associated migration of data from an initial SLC block of a plurality of SLC blocks to a first page of the QLC block until a second time of a final write operation associated with migration of data from a final SLC block of the plurality of SLC blocks to a last page of the QLC block. In some embodiments, the time period can extend from a first time associated with migration of data to a lower deck of the QLC memory block to a second time associated with migration of data to an upper deck of the QLC memory block.

The time period can be compared to a threshold time. For instance, at 462, the time period can be compared to the threshold time to determine whether the time period exceeds the threshold time, as detailed herein.

At 463, the QLC block can be designated as bimodal (e.g., designated as a bimodal block), as detailed herein. At 464, a voltage threshold level of a last successful read operation associated with the QLC memory block can be determined, as detailed herein. As mentioned, the last successful read can be a successful initial read or a successful read retry performed subsequent to failed initial read. A voltage threshold level of a last successful read operation associated with the QLC memory block can be determined responsive to the bimodal designation, at 463. At 465, a read threshold level of the QLC memory block can be set at the voltage threshold level of the last successful read operation, as detailed herein.

Figure 5:
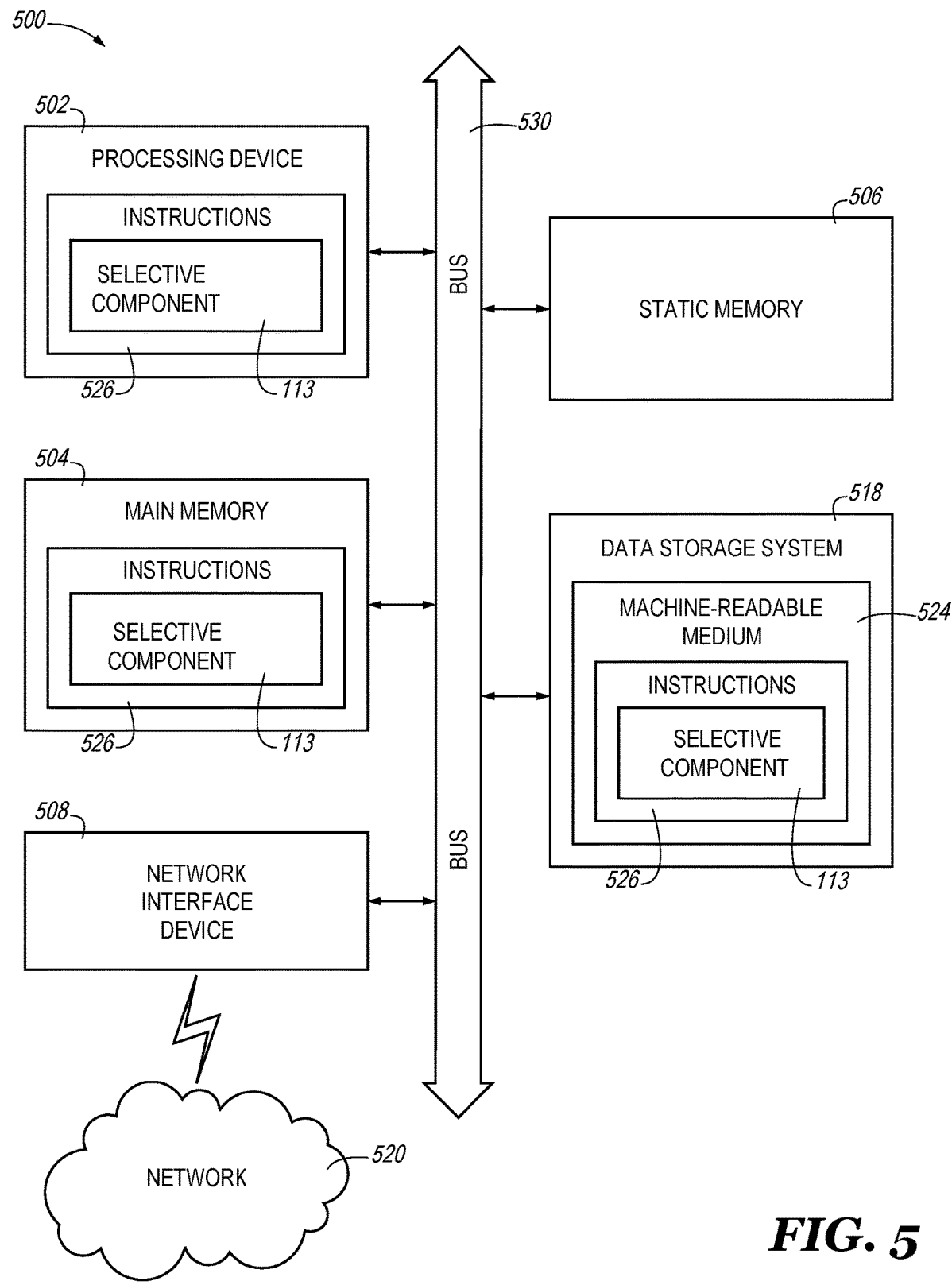
FIG. 5 is a block diagram of an example computer system in which embodiments of the present disclosure may operate.

FIG. 5 is a block diagram of an example computer system 500 in which embodiments of the present disclosure may operate. For example, FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the memory cell voltage level selection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

The processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a selective component (e.g., the memory cell voltage level selection component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer).

In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc. In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
    performing, over a time period, a quantity of write operations associated with a quad-level cell (QLC) memory block;
    determining the time period exceeds a threshold time;
    responsive to determining that the time period exceeds the threshold time, designating the QLC memory block as a bimodal;
    responsive to the bimodal designation, determining a voltage threshold level of a last successful read operation associated with the QLC memory block; and
    setting a read threshold level of at least a portion of the QLC memory block at the voltage threshold level of the last successful read operation.

2. The method of claim 1, further comprising performing, at the voltage threshold level of the last successful read operation, a subsequent read operation associated with the QLC memory block.

3. The method of claim 2, further comprising:
    determining data associated with the subsequent read operation is successfully decoded; and
    responsive to determining that the data associated with the subsequent read operation is successfully decoded, maintaining the voltage threshold level at the read threshold level for at least one additional read operation associated with the QLC memory block.

4. The method of claim 2, further comprising:
    determining data associated with the subsequent read operation is not successfully decoded; and
    responsive to determining that the data associated with the subsequent read operation is not successfully decoded, altering the read threshold level of the QLC memory block prior to conducting an additional read operation associated with the QLC memory block.

5. The method of claim 4, further comprising altering the read threshold level to an altered read threshold level that is less than the voltage threshold level.

6. The method of claim 1, further comprising performing a plurality of write operations to write data from single-level cell (SLC) memory blocks to the QLC memory block over the time period.

7. The method of claim 6, wherein the time period extends from a first time of an initial write operation associated with migration of data from an initial SLC block of the SLC blocks to a first page of the QLC block until a second time of a final write operation associated with migration of data from a final SLC block of the SLC blocks to a last page of the QLC block.

8. The method of claim 1, responsive to a determination that the time period is less than or equal to the threshold time, designating the QLC memory block as a normal block.

9. The method of claim 8, responsive to designating the QLC memory block as a normal block, maintaining a default voltage threshold level as the read threshold level for the entire QLC memory block.

10. The method of claim 9, wherein the default voltage threshold level is a device default read threshold, a desired final pass voltage (VpassR) based read threshold, or a system-managed read threshold.

11. An apparatus, comprising:
    a non-volatile memory comprising non-volatile memory blocks including a single-level cell (SLC) memory blocks and quad-level cell (QLC) memory blocks; and
    a controller configured to:
        in response to receipt of signaling indicative of an access request, write data associated with performance of a memory operation to the SLC memory blocks;
        migrate, over a time period, the data from the SLC memory blocks to a respective QLC memory block of the QLC memory blocks;
        determine the time period exceeds a threshold time;
        responsive to the determination that the time period exceeds the threshold time, designate the QLC memory block as bimodal;
        determine a voltage threshold level of a last successful read operation associated with the QLC memory block; and
        set the voltage threshold level as the read threshold level for at least a portion of the QLC memory block.

12. The apparatus of claim 11, wherein migration of the data from the SLC memory blocks further comprises migrating data from a plurality of SLC memory blocks into portions of the respective QLC memory block.

13. The apparatus of claim 11, wherein the signaling is indicative of a host initiated read.

14. The apparatus of claim 11, wherein the signaling is indicative of a memory device initiated read.

15. The apparatus of claim 11, wherein designation of the memory block as a bimodal block further comprises addition of information indicative of the memory block to a bimodal block list.

16. The apparatus of claim of claim 15, further comprising removal of the memory block from the bimodal block list responsive to determination that the read threshold level of the memory block is substantially equal to a default voltage threshold level.

17. A system comprising:
- a memory sub-system comprising a non-volatile memory including single-level cell (SLC) memory blocks and quad-level cell (QLC) memory blocks; and
- a processing device coupled to the memory sub-system, the processing device to perform operations comprising:
  - migrate, over a time period, data from the SLC memory blocks to an individual QLC memory block of the QLC memory blocks;
  - compare the time period to a threshold time;
  - responsive to a determination that the time period exceeds the threshold time, designate the individual QLC memory block as a bimodal block;
  - determine a voltage threshold level of a last successful read operation associated with the bimodal block;
  - set the voltage threshold level at the read threshold level of the last successful read operation associated with the bimodal block; and
  - perform, at the read threshold level, a read operation associated with at least a portion of the bimodal block.

18. The system of claim 17, wherein the QLC block further comprises an upper portion configured to a store a first quantity of data and a lower portion configured to store a second quantity of data.

19. The system of claim 18, further comprising performing, at the read threshold level, a read operation associated with at least the lower portion of the QLC block.

20. The system of claim 18, further comprising:
- performing, at the read threshold level, a read operation associated with the lower portion of the QLC block; and
- performing, at a default read threshold level, a read operation associate with the upper portion of the QLC block.

* * * * *

UNITED STATES PATENT AND TRADEMARK OFFICE
CERTIFICATE OF CORRECTION

| | |
|---|---|
| PATENT NO. | : 12,165,709 B2 |
| APPLICATION NO. | : 17/876346 |
| DATED | : December 10, 2024 |
| INVENTOR(S) | : Tingjun Xie et al. |

It is certified that error appears in the above-identified patent and that said Letters Patent is hereby corrected as shown below:

In the Claims

In Claim 11, at Column 18, Lines 35-36, "...including a single-level cell (SLC) memory blocks..." should read "...including single-level cell (SLC) memory blocks...".

In Claim 17, at Column 19, Line 12, "migrate, over..." should read "migrating, over...".

In Claim 17, at Column 19, Line 15, "compare the..." should read "comparing the...".

In Claim 17, at Column 19, Line 17, "...the threshold time, designate..." should read "...the threshold time, designating...".

In Claim 17, at Column 19, Line 19, "determine a voltage..." should read "determining a voltage...".

In Claim 17, at Column 20, Line 1, "set the voltage..." should read "setting the voltage...".

In Claim 17, at Column 20, Line 4, "perform, at the..." should read "performing, at the...".

Signed and Sealed this
Twenty-first Day of January, 2025

Coke Morgan Stewart
*Acting Director of the United States Patent and Trademark Office*